(12) United States Patent
Iki et al.

(10) Patent No.: US 7,119,391 B2
(45) Date of Patent: *Oct. 10, 2006

(54) SYSTEM AND METHOD OF MANUFACTURING A SUBSTRATE DEVICE

(75) Inventors: Takunori Iki, Suwa (JP); Tomohiko Hayashi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/633,682

(22) Filed: Aug. 5, 2003

(65) Prior Publication Data

US 2004/0056297 A1 Mar. 25, 2004

(30) Foreign Application Priority Data

Aug. 19, 2002 (JP) .............................. 2002-238483
Jul. 10, 2003 (JP) .............................. 2003-195081

(51) Int. Cl.
*H01L 21/00* (2006.01)

(52) U.S. Cl. ................. 257/306; 257/72; 257/E27.111; 257/E29.29

(58) Field of Classification Search ................ 257/59, 257/72, 306; 438/149, 151; 349/38, 44, 349/110, 139
See application file for complete search history.

(56) References Cited

U.S. PATENT DOCUMENTS 6,597,413 B1  7/2003  Kurashina
6,781,651 B1 * 8/2004  Song et al. ................. 349/111
6,835,955 B1 * 12/2004 Iki et al. ........................ 257/72

FOREIGN PATENT DOCUMENTS

| JP | A-04-022127 | 1/1992 |
| JP | 05-129333 A | 5/1993 |
| JP | A-09-061851 | 3/1997 |
| JP | A-10-197897 | 7/1998 |
| JP | A-10-274789 | 10/1998 |
| JP | 11-354811 A | 12/1999 |
| JP | A-2000-010120 | 1/2000 |
| JP | A-2001-013518 | 1/2001 |
| JP | A-2001-066631 | 3/2001 |
| JP | A-2001-066638 | 3/2001 |
| JP | A-2002-057341 | 2/2002 |
| JP | 2002-094072 A | 3/2002 |
| JP | A-2002-090721 | 3/2002 |
| JP | A-2002-098409 | 4/2002 |
| JP | A-2002-131778 | 5/2002 |
| WO | WO 01/82273 A1 | 11/2001 |

* cited by examiner

*Primary Examiner*—Alexander Ghyka
(74) *Attorney, Agent, or Firm*—Oliff & Berridge, PLC

(57) ABSTRACT

The invention provides a substrate device having thin film transistors (TFTs), each including a semiconductor layer and capacitors formed above the TFTs, that are provided on a substrate. Each of the capacitors can include a first electrode electrically connected to a part of the semiconductor layer, a second electrode arranged to face the first electrode, and a dielectric film including a nitride film arranged between the first electrode and the second electrode on the substrate. Further, the nitride film has an aperture facing the semiconductor layer as seen in plan view. Accordingly, it is possible to effectively hydrogenate the semiconductor layer using the aperture.

13 Claims, 11 Drawing Sheets

STEP (1)

STEP (2)

STEP (3)

STEP (4)

STEP (5)

STEP (6)

STEP (7)

STEP (8)

STEP (9)

STEP (10)

SYSTEM AND METHOD OF MANUFACTURING A SUBSTRATE DEVICE

BACKGROUND OF THE INVENTION

1. Field of Invention

The present invention relates to the art of a substrate device, such as a thin film transistor (TFT) array substrate device, in which TFTs are formed, a method for manufacturing the same, and an electro-optical device such as a liquid crystal device and an electronic apparatus provided with such a substrate device.

2. Description of Related Art

A substrate device, such as the TFT, has semiconductor layers, such as polysilicon films or amorphous silicon films each including a source region, a drain region, and a channel region on a substrate such as a quartz substrate. Gate insulating films formed of a high-temperature oxide ("HTO") film, such as a thermal oxide film formed by dry oxidation or wet oxidation, a tetraethyl orthosilicate ("TEOS") film, or a plasma oxide film, are formed on the surfaces of the semiconductor layers. Gate electrode films can be formed on the gate insulating films to form the TFTs on the substrate. The TFTs are formed in individual pixels in an image display region of an electro-optical device, such as a liquid crystal device, to be used as pixel-switching elements in the TFT-array substrate device. TFTs are also formed in a peripheral region of the image display region to be used as a part of a circuit for driving the substrate device.

Also, N-channel type TFTs, which are excellent in carrier mobility because of electrons as carriers, that is, excellent in switching properties, are commonly created in the image display region. CMOS (complementary) type TFTs formed of a pair of an N-channel type TFT and a P-channel type TFT and driven by a small amount of driving current are commonly created in the peripheral region.

The substrate device where the TFTs are formed in the image display region or the peripheral region is widely used in various electro-optical devices including a liquid crystal device of a TFT active matrix driving method. Additionally, such substrate devices are generally required to have superior electrical properties like high performance and high reliability. In particular, it is required that the TFTs that form the substrate device have a higher performance and higher reliability with respect to leakage current properties, interface state density, and a hot carrier tolerance (that is, the leakage current and the interface state density are lower and the hot carrier tolerance is higher). Of course, it is also required to maintain such excellent transistor properties for a relatively long time.

In order to meet such requirements, it is necessary to efficiently perform an appropriate process, that is, the removal or termination of dangling bonds generated in a crystal grain boundary in the semiconductor layer or an interface between the semiconductor layer and the gate insulating film. This is because the on/off properties of the TFTs deteriorate if the dangling bonds resides. Further, it is necessary to prevent moisture from permeating the gate insulating film that forms the TFT or the interface between the gate insulating film and the semiconductor layer. If moisture permeates such film or interface, the threshold voltage Vth of the TFTs increases. In view of maintaining the excellent properties, it is preferable to remove the above-described inconveniences.

Several technique for solving the above problems are provided in conventional technology. However, considering that it is commonly required that the properties of the TFT be generally and significantly improved, it is difficult to say that the complete technique of solving the problems have been proposed.

Further, such problems matter more in the case where the substrate device corresponds to the TFT-array substrate that forms the electro-optical device such as the liquid crystal device capable of displaying images. It is required that such an electro-optical device displays high quality images and maintains high quality images for a long time, which is significantly dependent on the properties of the TFT on the TFT-array substrate.

SUMMARY OF THE INVENTION

The present invention has been made in consideration of the above problems. It is therefore an object of the present invention to provide a substrate device with thin film transistors, which has excellent transistor properties and is capable of maintaining excellent transistor properties for a relatively long time, a method of manufacturing the same and an electro-optical device and an electronic apparatus provided with such a substrate device.

In order to solve the above problems, there is provided a substrate device, that can include thin film transistors provided above a substrate, each including a semiconductor layer, and capacitors formed above the thin film transistors, each of the capacitors having a first electrode electrically connected to a part of the semiconductor layer, a second electrode arranged to face the first electrode, and a dielectric film including a nitride film arranged between the first electrode and the second electrode. The nitride film can have an aperture for hydrogenating the semiconductor layer.

The substrate device according to the present invention can include a thin film transistor, and a capacitor electrically connected to a part of the semiconductor layer which is an element of the thin film transistor. According to the present invention, in addition to the above structure, the thin film transistor include, for example, a gate electrode formed through a gate insulating film to face a channel region in the semiconductor layer and a source electrode and a drain electrode, which are electrically connected to a source region and a drain region in the same semiconductor layer. Thus, it is possible to use the thin film transistor as a switching element for controlling conduction between the source electrode and the drain electrode by applying the electrical current to the gate electrode. Further, the capacitor can be used to store predetermined charges in accordance with the switching operation of the thin film transistor because the first electrode which is an element of the capacitor is connected to a part of the semiconductor layer, for example, a drain region or a drain electrode thereof. The thin film transistor and the capacitor can be appropriately used as, for example, a pixel-switching element and a storage capacitor in the electro-optical device such as a liquid crystal device, which will be described in greater detail below.

In the present invention, in particular, a dielectric film that forms the capacitor includes a nitride film. Thus, it is possible to increase the capacity of the capacitor because the dielectric film is not formed of an oxide film as in conventional technology, but of a nitride film with a relatively large dielectric constant. Further, the nitride film prevents moisture from permeating. Thus, it is possible to prevent the occurrence of a phenomenon where water molecules diffuse to the gate insulating film of the thin film transistor and the interface of the semiconductor layer and thereby positive charges are generated to increase a threshold voltage Vth.

Moreover, the above phenomenon is remarkably found in a P-channel type TFT whose carrier is a hole.

Further, the nitride film according to the present invention, in particular, includes an aperture for hydrogenating the semiconductor layer. This allows the following effects. That is, in the present invention where the dielectric film includes the nitride film, it is possible to obtain the above-described effects that the capacity of the capacitor increases and the moisture proof properties of the thin film transistor improve. However, the nitride film obstructs the hydrogenation of the thin film transistor, which is useful in improving the properties of the thin film transistor. The hydrogenation means a process aiming at the termination (generating, for example, Si—H bonds or Si—OH bonds) of dangling bonds in the semiconductor layer of the thin film transistor or in the interface of the gate insulating film that forms the semiconductor layer and the thin film transistor. Thus, it is possible to prevent a bad influence that may be caused by the residing dangling bonds such as the deterioration of the on/off current properties of the thin film transistor which results from the generation of an interface level due to the residing dangling bonds. However, the nitride film obstructs the progress of hydrogen because the structure thereof is dense. Accordingly, when the capacitor including the nitride film as a dielectric film is arranged on the thin film transistor, it is not possible to sufficiently and effectively process the hydrogenation.

However, in the present invention, an aperture is included in the dielectric film including the nitride film, as described above. Thus, hydrogen can easily reach the thin film transistor or the semiconductor layer which is an element of the thin film transistor through the aperture. Accordingly, it is possible to effectively perform the hydrogenation on the thin film transistor.

As described above, according to the present invention, it is possible to obtain the effects of both the nitride film and hydrogenation. That is, it is possible to improve the properties of the thin film transistor, such as maintaining the excellent on/off properties of the thin film transistor, reducing the probability of increasing the threshold voltage Vth, and improving a hot carrier tolerance. Further, it is possible to maintain such excellent properties for a relatively long period.

Further, it is advantageous that the "aperture" according to the present invention has a function of securing the path of hydrogen between the semiconductor layer and the nitride film as obvious from the above description. For example, when parts below the nitride film are seen in a plan view on the basis of the position of the nitride film, it is a preferable example where the surface of the semiconductor layer is seen directly below the aperture through the aperture. It is another preferable example where, although the surface of the semiconductor layer cannot be seen, a path of hydrogen leading to the semiconductor layer from the aperture exists. As a more specific example for the latter case, it can be assumed that the nitride film exists directly above the semiconductor layer and the aperture of the nitride film exists to the upper left or the upper right of the semiconductor layer. The aperture according to the present invention includes an aperture which is be formed in a region that faces the semiconductor layer so called in the direction of inclination as seen from the thin film transistor.

Further, such an aperture can be obtained by, for example, forming a nitride film on the entire surface of the substrate and then patterning the nitride film using a photolithography.

Moreover, it is assumed that a silicon nitride film (an "SiN film" or an "SiON film") represents the nitride film according to the present invention. However, other films than the silicon nitride film can be favorably used as the nitride film according to the present invention. Furthermore, the nitride film according to the present invention is most preferably formed by the nitration by plasma or a spattering method. However, the nitride film can be formed by other various film formation methods such as a PVD (physical vapor deposition) method and a CVD (chemical vapor deposition) method.

There are no particular limitations on device to which the above-described substrate device is specifically applied. However, the substrate device is preferably applied to a TFT-array substrate that forms a liquid crystal device.

In an aspect of the substrate device of the present invention, the aperture is formed vertically above the semiconductor layer.

According to this aspect, when the parts below the nitride film are seen in a plan view on the basis of the position of the nitride film, the surface of the semiconductor layer can be seen through the aperture directly below the aperture. Accordingly, according to this aspect, it is possible to effectively introduce hydrogen into the semiconductor layer in performing the hydrogenation. This allows the dangling bonds in the semiconductor layer to be more effectively removed and the thin film transistors with higher properties to be constructed.

In this aspect, in particular, the aperture is preferably formed vertically above a channel region of the semiconductor layer. According to such a construction, it is possible to effectively perform the hydrogenation in an interface between a channel region and a gate insulating film where it is most required to remove the dangling bond.

In an aspect of substrate device of the present invention, the dielectric film has a laminated structure including a layer formed of the nitride film.

According to this aspect, because a layer formed of the nitride film is included, it is possible to obtain such effects that the nitride film increases the capacity and prevents the permeation of moisture. In the present aspect, a laminated structure including a layer formed of the nitride film is adopted, that is, layers other than the layer formed of the nitride film are included. Accordingly, if the materials of the other layers that form the laminated structure are appropriately selected, it is possible to obtain other effects such as the improvement in the voltage-proof properties of the capacitor.

In this aspect, in particular, a layer formed of an oxide film is preferably included in the laminated structure.

According to such a construction, the nitride film having a larger dielectric constant than that of the oxide film is included in the laminated structure that forms the dielectric film. Thus, it is possible to obtain an effect of the increase in the capacity and to prevent the deterioration of the voltage-proof property. More specifically, for example, in a state where the total thickness of about 30 nm is secured by a three-layer structure formed of an oxide film of 10 nm thick, a nitride film of 10 nm thick and an oxide film of 10 nm thick in that order, it is possible to obtain relatively enough voltage-proof performance against a driving voltage of about 12V.

Further, in this connection, the thickness of the nitride film according to the present invention varies specifically and individually in accordance with the specific method of hydrogenation, the quality and the thickness of the semiconductor layer to be hydrogenated, the degree of hydrogenation required corresponding to the specification of the substrate device, the quality of the nitride film, a method of forming the nitride film and the performance required as the dielectric film of the capacitor. In the present invention, it is possible to previously, individually and specifically set such a predetermined thickness by experiments, experiences, theories, and simulations prior to manufacturing the substrate device. Once the predetermined thickness is set, it is possible to perform the hydrogenation well without correcting the thickness of the nitride film in the case of mass production and a batch process. As a result, the nitride film is hydrogenated sufficiently and functions well as the dielectric film of the capacitor in the finally manufactured substrate device. Accordingly, the excellent transistor and capacitor properties are realized. Furthermore, because the nitride film exists, the waterproof and wet-proof properties are excellent.

In another aspect of the substrate device of the present invention, the plurality of thin film transistors is arranged above the substrate in array. According to this aspect, it is possible to construct the TFT-array substrate device appropriately used for the electro-optical device such as the liquid crystal device of the TFT active matrix driving method.

In order to achieve the above object, there is provided an electro-optical device, that can include scanning lines extending above a substrate, data lines extending in a direction intersecting the scanning lines, thin film transistors formed to correspond to each intersection between the scanning lines and the data lines, each including a semiconductor layer, pixel electrodes provided to correspond to the thin film transistor, and storage capacitors formed above the thin film transistors, each of the storage capacitors comprising a first electrode electrically connected to a part of the semiconductor layer, a second electrode arranged to face the first electrode, and a dielectric film including a nitride film arranged between the first electrode and the second electrode. The nitride film has an aperture for hydrogenating the semiconductor layer.

According to the electro-optical device of the present invention, it is possible to control the application of data signals through data lines to pixel electrodes by providing scanning signals through scanning lines to control on/off of the thin film transistors used as pixel-switching elements. Besides the above-described elements, when other necessary elements such as a counter substrate having a counter electrode to face the substrate with the pixel electrodes and an electro-optical material (hereinafter, represented by liquid crystal), such as liquid crystal between the pixel electrode and the counter electrode are provided, it is possible to generate a predetermined potential difference between both substrates to apply an electric field to the liquid crystal. This allows the alignment state of liquid crystal molecules to be changed. Thus, when the liquid crystal is irradiated with light, it is possible to change the transmittance of the liquid crystal and to thus display an image. Further, in the present invention, because a storage capacitor electrically connected to a part of the semiconductor layer that forms the thin film transistor is included, it is possible to maintain the potential of the pixel electrode. Furthermore, the potential difference between the pixel electrode and the counter electrode for a relatively long period. Accordingly, it is possible to display a high quality image with a high contrast ratio.

Further, in the electro-optical device of the present invention, in particular, because the above-described substrate device is provided, as obvious from the structure thereof, it is possible to obtain almost the same effects as the previously described effects. In other words, it is possible to have the benefits of an increase in the capacity of the storage capacitor (capacitor) with the dielectric film including the nitride film and the improvement of the moisture proof properties of the thin film transistor with the presence of the nitride film. In addition, it is possible to appropriately perform hydrogenation on the semiconductor layer of the thin film transistor because the nitride film has the aperture for hydrogenating the semiconductor layer.

Accordingly, according to the electro-optical device of the present invention, the thin film transistor used as the pixel-switching element has excellent properties and an ability to maintain those excellent properties for a relatively long period. Thus, the electro-optical device can display a high quality image and stably operate for a long period.

In an aspect of the electro-optical device of the present invention, the apertures are formed within regions where the pixel electrodes are formed. According to this aspect, because the aperture of the nitride film is formed within the region where the pixel electrode is formed, the presence of the nitride film does not obstruct the transmission of light expected in the region. That is, because light can transmit through the aperture, it is possible to maintain the brightness of an image.

In another aspect of the present invention, the pixel electrodes and the thin film transistors are arranged in a matrix, and the scanning lines are formed in stripes to correspond to the matrix. The device further comprises capacitive lines of fixed potential formed parallel to the scanning lines. The capacitive lines include the second electrodes.

According to this aspect, the second electrode constituting the storage capacitor forms at least a part of a capacitive line of fixed potential which is formed parallel to the scanning line. This makes it possible to reduce the number of wiring lines for making the capacitive line (the second electrode) with a fixed potential. Thus, the structure of the device is simplified. Further, in this aspect, it is possible to have the capacitive line and the scanning line overlap each other as seen in plan view. Therefore, it is possible to increase a pixel aperture ratio, compared to a case where the storage capacitor or the capacitive line is formed to be caught in a light transmission region as in conventional technology. Accordingly, this results in a brighter image. Further, according to this aspect, it is possible to increase the degrees of freedom of the layout of the storage capacitor, thin film transistor and pixel electrode on a substrate and to more efficiently perform the layout thereof.

In another aspect of the present invention, the electro-optical device further comprises first contact holes for electrically connecting the first electrodes to a part of the semiconductor layer and second contact holes for electrically connecting the first electrodes to the pixel electrodes. According to this aspect, an electrical connection of the first electrode that forms the storage capacitor, to each of a part of the semiconductor layer and the pixel electrode is established by the first and second contact holes. Accordingly, it is possible to increase the degrees of freedom of the layout of the storage capacitor, thin film transistor and pixel electrode on the substrate and to more efficiently perform the layout thereof. Further, still in this aspect, it is possible to more efficiently perform the layout of the thin film transistor, the storage capacitor and the pixel electrode on the substrate.

In this aspect, in particular, the thin film transistors are a plurality of N-channel type thin film transistors arranged in array. The thin film transistors are provided in pixels in the image display region above the substrate for switching the pixels.

According to such a construction, the N-channel type TFTs having excellent carrier mobility can be constructed as the pixel switching TFTs because electrons are a carrier.

A CMOS TFT including a P-channel type TFT can be used as a peripheral circuit in addition to an N-channel type TFT that can be simultaneously formed by the same process as that of the N-channel type TFT. Accordingly, the device as a whole includes the transistor with excellent properties. Further, it is possible to realize a long-life substrate device.

According to the present invention, there is provided a method of manufacturing a substrate device, that can include the steps forming thin film transistors above a substrate, each including a semiconductor layer, forming first electrodes electrically connected to a part of the semiconductor layer above the thin film transistors; forming second electrodes to face the first electrodes, forming dielectric films including a nitride film on the first electrodes or the second electrodes after forming the first electrodes or the second electrodes, forming apertures for hydrogenating the semiconductor layer by patterning the nitride film, and hydrogenating the semiconductor layer by introducing hydrogen into the semiconductor layer through the apertures.

According to the method of manufacturing the substrate device of the present invention, the thin film transistors and capacitors are finally manufactured on the substrate. Each thin film transistor includes the semiconductor layer. A source region, a drain region and a channel region can be formed in the semiconductor layer by performing a process of introducing appropriate impurities thereinto. Further, each capacitor is manufactured by forming the first electrode, the dielectric film and the second electrode. The first electrode is electrically connected to a part of the semiconductor layer, for example, the drain region.

In the present invention, in particular, the semiconductor layer is hydrogenated in an intermediate step of the process of forming the capacitor. In other words, after forming either the first electrode or the second electrode, the dielectric film including the nitride film is formed on the formed electrode, and the nitride film is patterned. As a result, the aperture for hydrogenating the semiconductor layer is formed. Hydrogen is introduced into the semiconductor layer through the aperture to hydrogenate the semiconductor layer. In addition, the hydrogenation is a process with the above-described contents and meaning.

According to the present invention, it is possible to effectively hydrogenate the semiconductor layer because it is possible to introduce hydrogen to the semiconductor layer through the aperture. Accordingly, in the substrate device manufactured by the method according to the present invention, it is possible to construct the thin film transistor with excellent on/off properties. Further, in the substrate device, because the nitride film is included in the dielectric film of the capacitor, it is possible to increase the capacity of the capacitor and to prevent moisture from permeating the semiconductor layer of the thin film transistor with the presence of the nitride film. Thus, it is possible to prevent a threshold voltage from increasing.

Furthermore, in the present invention, as obvious from the above description, either the first electrode or the second electrode may be formed first. In the case of forming the first electrode first, the capacitor has a laminated structure where the first electrode, the dielectric film and the second electrode are formed on the thin film transistor in the order from the bottom. On the contrary, in the case of forming the second electrode first, the capacitor has a laminated structure in the reverse order. In these cases, because the first electrode is electrically connected to a part of the semiconductor layer, it is not specifically limited whether a specific portion, in which the thin film transistor and the capacitor are connected to each other, is an upper electrode film or a lower electrode film according to the present invention.

In order to solve the above problems, an electronic apparatus according to the present invention includes the above-described electro-optical device (including various aspects thereof) according to the present invention.

According to this aspect, because the above-described substrate device according to the present invention is provided, it is possible to realize various electronic apparatuses, such as projection-type display devices or a projectors, liquid crystal TVs, monitors of personal computers and mobile or portable terminals, pagers, display units of mobile phones and finders of cameras, each of which has a high-performance and long-life electro-optical device as a display unit.

The operations and the advantages of the present invention are clarified from the embodiments which will be described next.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Figure 1:
FIG. 1 is a flow diagram illustrating an exemplary method of manufacturing a substrate device according to a first embodiment of the present invention in the order (step (1))
Figure 1:
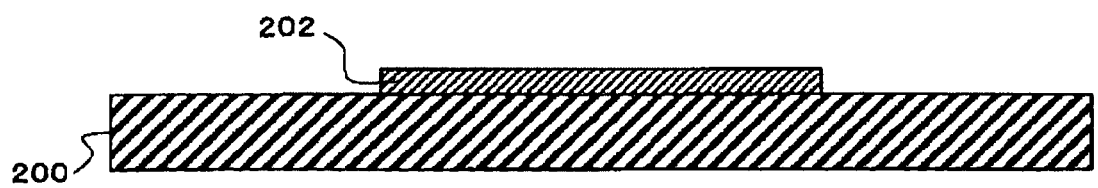
Figure 1:
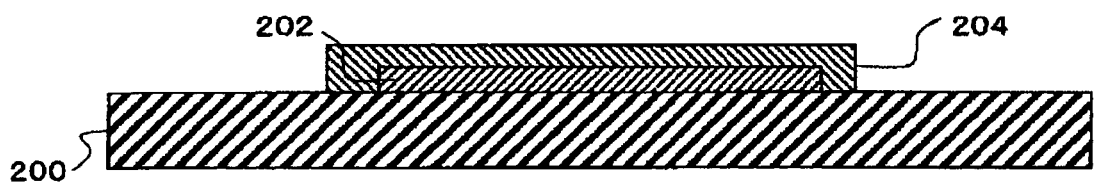
Figure 1:
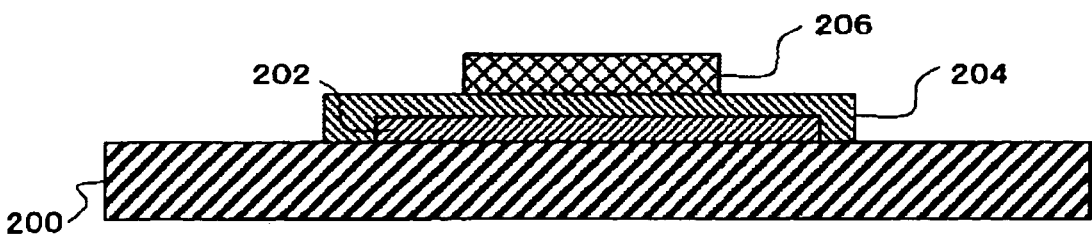
Figure 2:
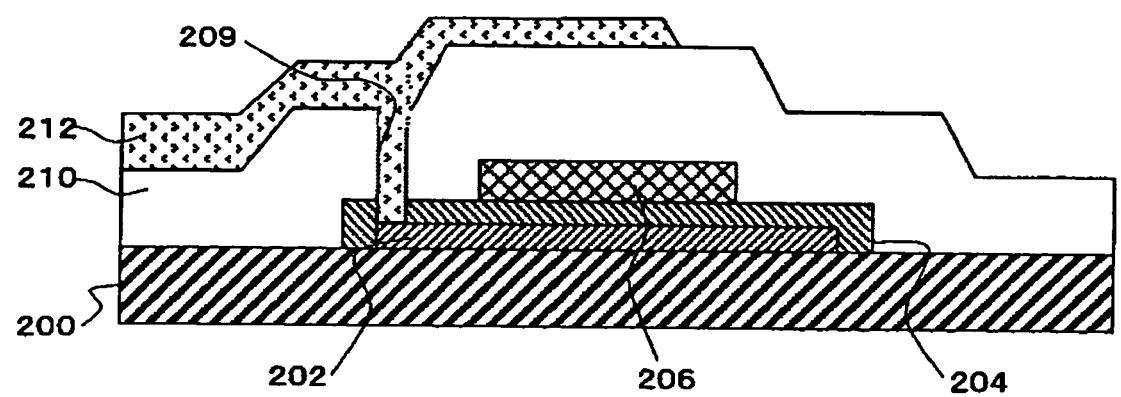
FIG. 2 is a flow diagram illustrating an exemplary method of manufacturing a substrate device according to a first embodiment of the present invention in the order (step (2))
Figure 2:
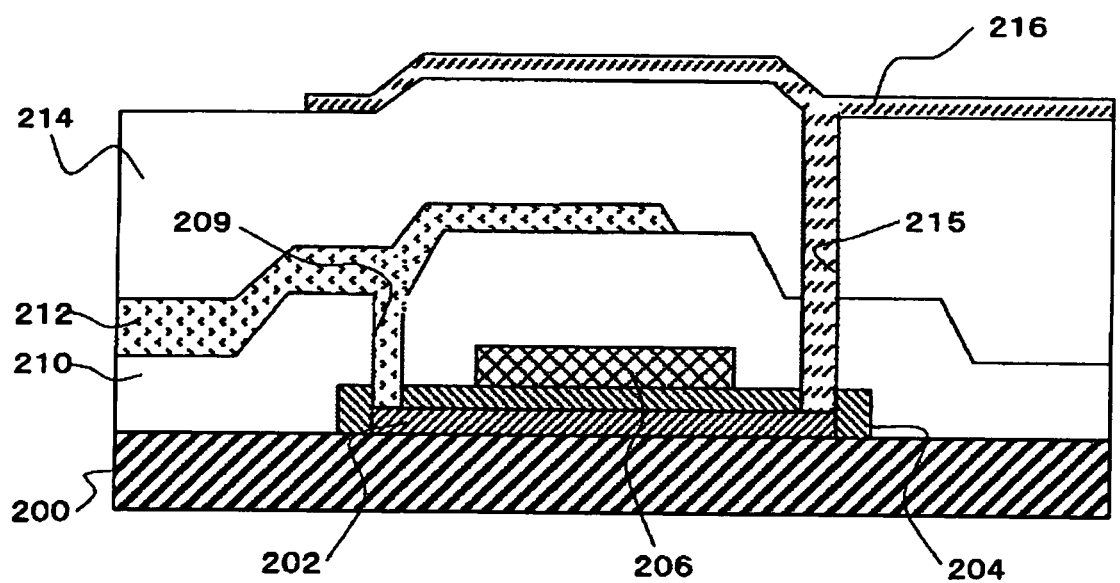
Figure 3:
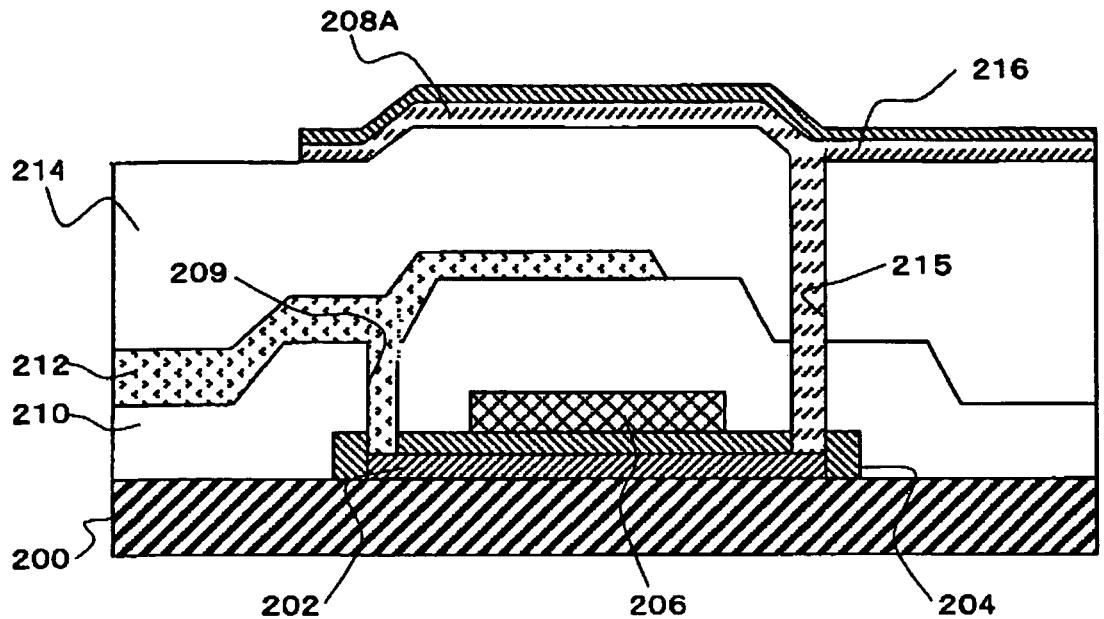
FIG. 3 is a flow diagram illustrating an exemplary method of manufacturing a substrate device according to a first embodiment of the present invention in the order (step (3))
Figure 3:
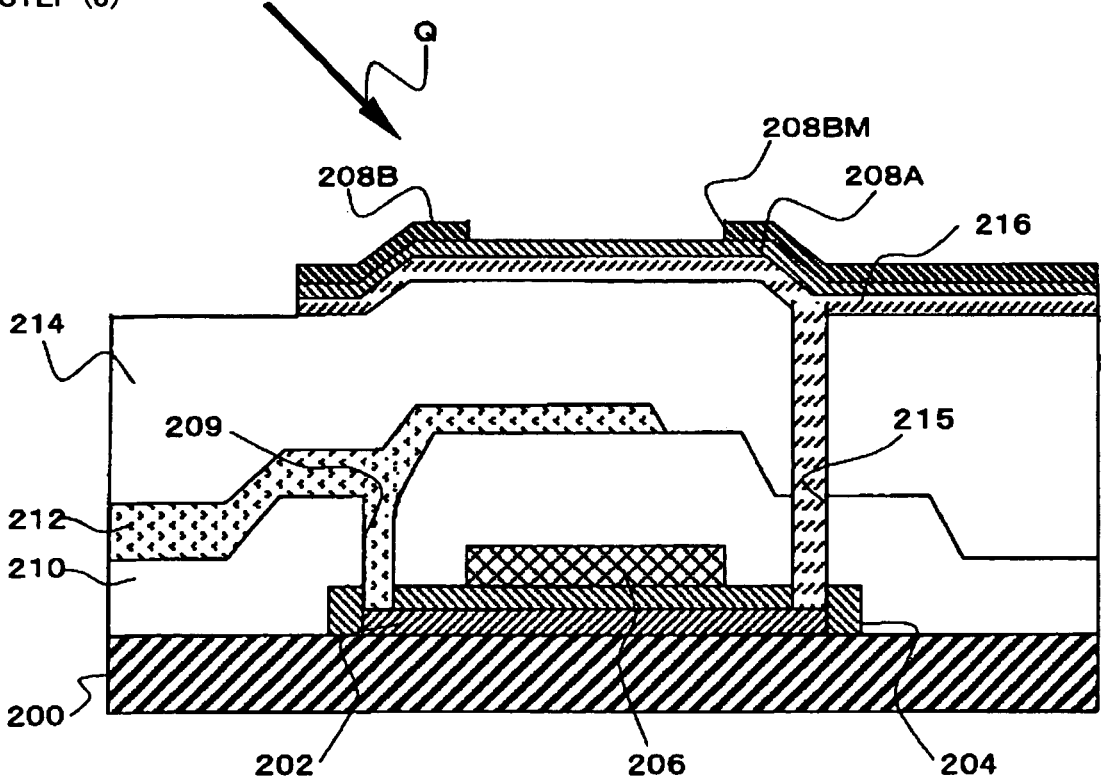

Embodiments of the present invention will now be described with reference to the drawings. First, the manufacturing method and the structure of a substrate device according to a first embodiment of the present invention will now be described with reference to FIGS. 1 to 5. Herein, FIGS. 1 to 4 are flow diagrams illustrating the method of manufacturing the substrate device according to the first embodiment in the order. FIGS. 1 to 4 illustrate the structure of a section around a TFT in each process. Further, FIG. 5 is a view illustrating the layout between an aperture formed in a nitride film in a process of forming the nitride film in step (8) of FIG. 3 and a polysilicon film positioned under the aperture which is an example of a semiconductor layer of the TFT. Moreover, in the drawings referred to in the first embodiment and the following second embodiment, which will be described later, a scale varies in each layer and member so that the layers and the members have recognizable sizes in the drawings.

In FIG. 1, in step (1), a substrate 200 formed of, for example, glass, quartz and plastic is prepared. In step (2), after forming polysilicon film on the substrate, photolithography and etching is performed on the polysilicon film to form a polysilicon film 202 (an example of the semiconductor layer according to the present invention) of a predetermined pattern including a source region, a channel region and a drain region of the TFT. Such a polysilicon film 202 may be formed of a low-temperature polysilicon film, a high-temperature polysilicon film or an amorphous silicon film.

Next, in step (3), a thermal oxide silicon film 204 serving as a gate insulating film that forms the TFT (to be described later) is formed on the surface of the polysilicon film 202 by dry oxidation. The thermal oxide silicon film 204 can be formed by, for example, dry-oxidizing the surface of the polysilicon film 202. However, the present invention may include at least one of a method of forming a tetraethyl orthosilicate (TEOS) film using wet oxidation or a CVD method and a method of forming the oxide film using plasma in addition to the dry oxidation. Further, in some cases, after forming the thermal oxide film by the dry oxidation, a plasma oxide film may be formed on the thermal oxide film.

In step (4), a gate electrode film 206 is formed on a thermal oxide silicon film 204. The gate electrode film 206 is formed by, for example, depositing a polysilicon film by a low pressure CVD method and further thermal-diffusing phosphor to make the film conductive. Further, it is common that a polysilicon film is deposited on the entire surface of the substrate 200 to use the resulting film as an original film, and the polysilicon film is patterned to have a desired pattern using the photolithography, thereby forming the gate electrode film 206. Moreover, the gate electrode film 206 may be formed of other materials and other manufacturing methods.

Furthermore, in step (4), a source region, a channel region and a drain region may be formed in the polysilicon film 202 by introducing impurities into the polysilicon film 202 using the gate electrode film 206 as a mask. When the impurities are boron ions, etc., the finally formed TFT is the P-channel type TFT. When the impurities are phosphorous ions, arsenic ions, etc., the finally formed TFT is an N-channel type TFT. When the impurities are introduced using the gate electrode film 206 as a mask, it is possible to form the source region, the channel region and the drain region by self-matching.

In step (5), after forming a first interlayer insulating film 210 formed of an oxide silicon film, etc., dry etching is performed on the first interlayer insulating film 210 to provide a contact hole 209 that leads to the source region of the polysilicon film 202, and to form a source electrode film 212 formed of, for example, aluminum on the first interlayer insulating film 210 and inside the contact hole 209. Further, in step (5), the first interlayer dielectric film 210 can be formed of a silicate glass film such as non-silicate glass (NGS), phosphorous silicate glass (PSG), boron silicate glass (BSG) and boron phosphorous silicate glass (BPSG), a nitride silicon film or an oxide silicon film by, for example, a normal pressure or low pressure CVD method using a TEOS gas, a tetraethyl borate (TEB) gas and tetramethyl oxyphoslate (TMOP) gas. The same is true of a second interlayer insulating film 214, which is formed right after forming the first interlayer insulating film 210.

Next, in step (6), after forming the source electrode film 212 and then forming the second interlayer insulating film 214, the dry etching is performed on the second interlayer insulating film 214 and the first interlayer insulating film 210 to locate a contact hole 215 that leads to the drain region of the polysilicon film 202 and to form a drain electrode film 216 formed of a conductive film on the second interlayer insulating film 214 and inside the contact hole 215. The TFT is formed on the substrate 200 by steps (1) to (6).

Next, according to the first embodiment, in particular, in step (7), an oxide film 208A formed of, for example, a silicon oxide film (an SiO film) is formed on the drain electrode film 216. In the subsequent step (8), a nitride film 208B formed of, for example, a silicon nitride film (an SiN film or an SiON film) is formed on the oxide film 208A. These oxide film 208A and nitride film 208B can be formed by, for example, oxidation or nitration by plasma or a spattering method respectively. The thickness of the oxide film 208A is preferably about 20 nm. The thickness of the nitride film 208B is preferably about 10 nm.

Moreover, the oxide film 208A and the nitride film 208B are appropriately patterned by the photolithography. In particular, the nitride film 208B is patterned so that an aperture 208BM is formed vertically above the polysilicon film 202. The aperture 208BM of the nitride film 208B and the polysilicon film 202 are arranged as illustrated in step (8) of FIG. 3 and FIG. 5. Herein, FIG. 5 is an explanatory view illustrating a state where the arrangement is perspectively seen in the direction of an arrow Q of step (8) of FIG. 3.

Further, in FIG. 5, only the nitride film 208B and the polysilicon film 202 are illustrated in order to illustrate the arrangement of the nitride film 208B and the polysilicon film 202 to be easily understood. Other elements such as the gate electrode film 206, the source electrode film 212 and the drain electrode 216 are not shown.

In FIG. 5, the polysilicon film 202 is I-shaped as seen in plan view. The lower end of the contact hole 215 for electrically connecting the drain region of the polysilicon film 202 to the drain electrode film 216 is provided in one end of the polysilicon film 202. Further, the lower end of the contact hole 209 for electrically connecting the source region of the polysilicon film 202 to the source electrode film 212 is provided in the other end of the polysilicon film 202. In FIG. 5, in particular, the aperture 208BM is formed substantially in the center of the nitride film 208B. When the aperture 208BM is looked into, the surface of a channel region 202a' of the polysilicon film 202 can be seen (the channel region 202a' cannot necessarily be actually seen because other elements such as the gate electrode film 206 exist).

Figure 4:
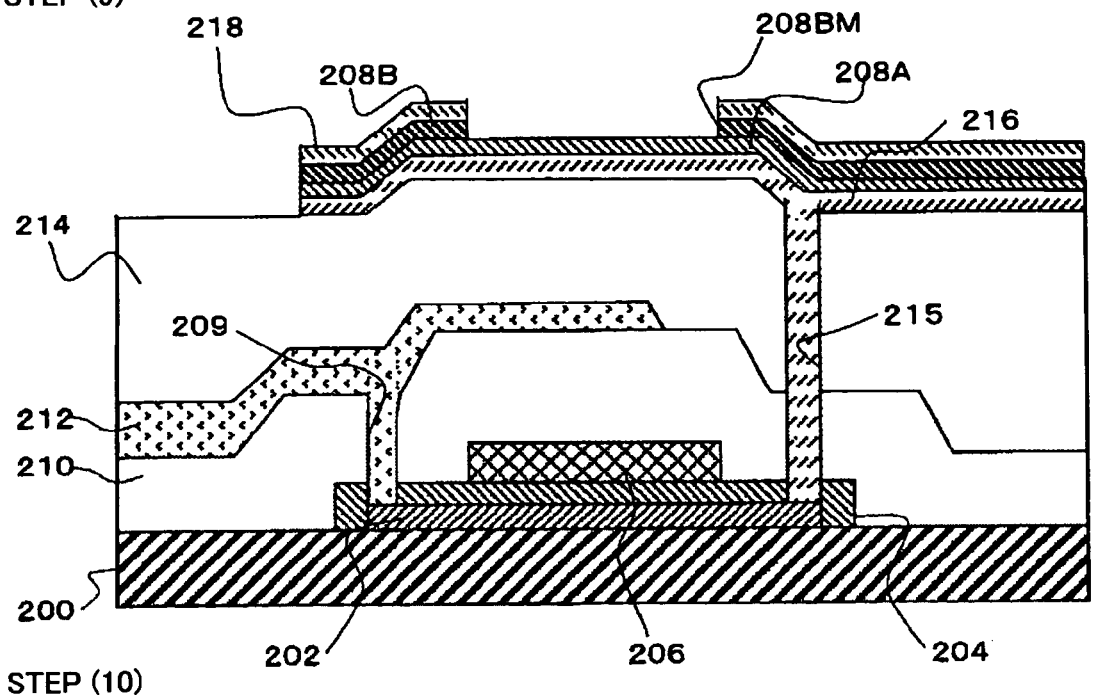
FIG. 4 is a flow diagram illustrating an exemplary method of manufacturing a substrate device according to a first embodiment of the present invention in the order (step (4))
Figure 4:
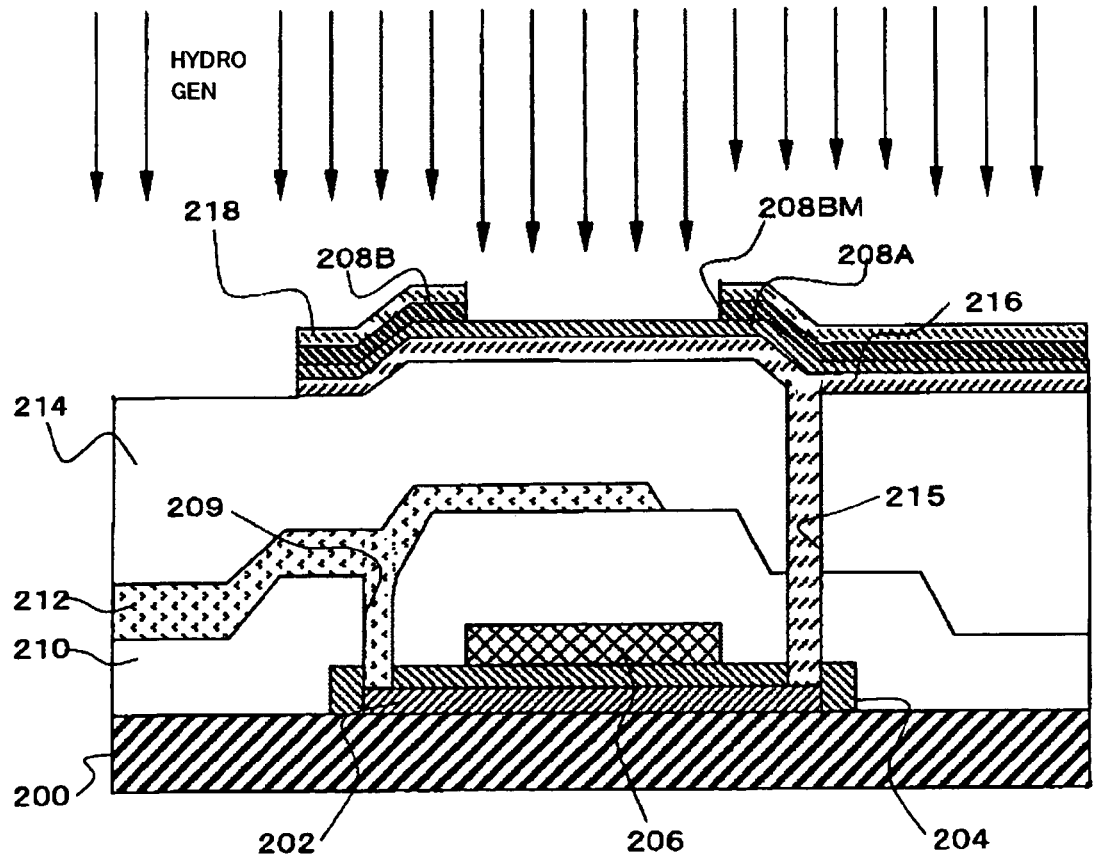
Figure 5:
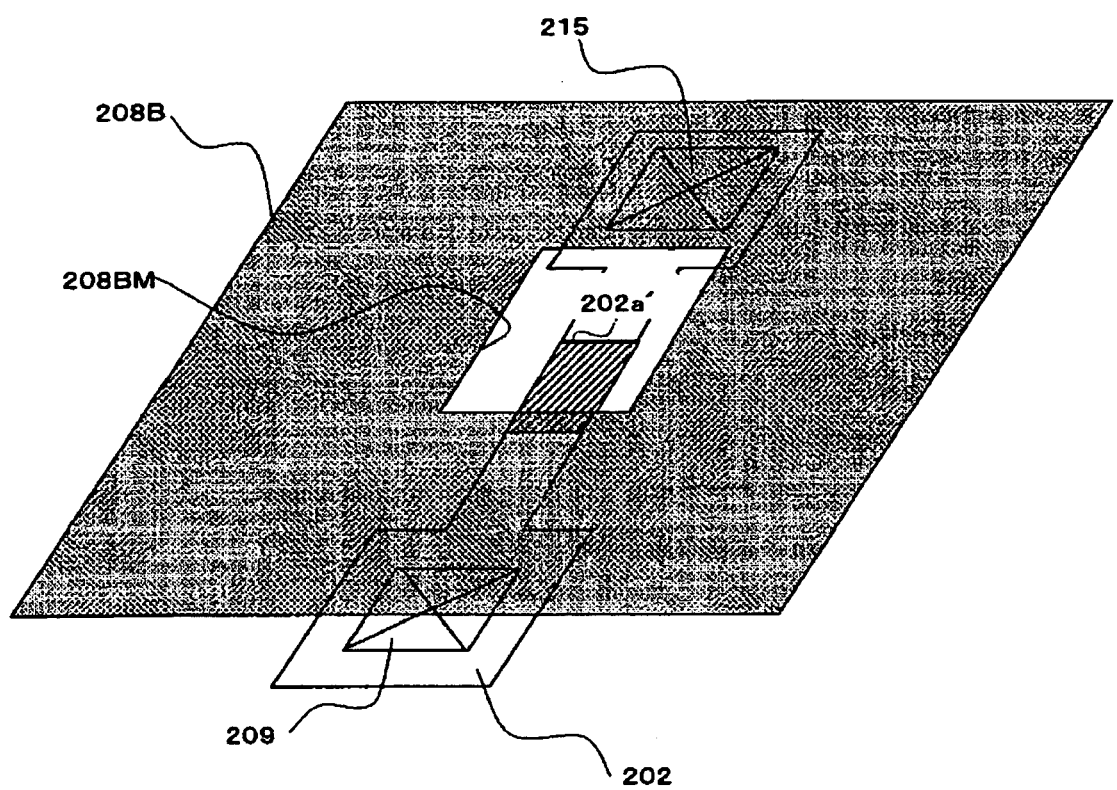
FIG. 5 is a perspective view illustrating an arrangement relationship between the nitride film and aperture thereof formed in step (8) of FIG. 3 and the polysilicon film that is the semiconductor layer of the TFT.

After forming the aperture 208BM, as illustrated in step (9) of FIG. 4, an upper electrode film 218 formed of an appropriate conductive material is formed on the nitride film 208B. An aperture is formed in the upper electrode film 218 using the photolithography to correspond to the position where the aperture 208BM is formed in the nitride film 208B. This makes it possible to significantly reduce the probability of making a short circuit between the upper electrode film 218 and the drain electrode film 216. However, according to the first embodiment, the oxide film 208A is provided as described above. Thus, the aperture is not necessarily provided in the upper electrode film 218 unless the aperture is formed in the oxide film 208A as illustrated in FIG. 4. This is because the short circuit is not immediately made between the upper electrode 218 and the drain electrode film 216 with the insulating properties of the oxide film 208A even if the aperture is not formed in the upper electrode film 218.

A capacitor formed of the drain electrode film 216, the dielectric film formed of the oxide film 208A and the nitride film 208B, and the upper electrode film 218 is formed on the TFT including the polysilicon film 202 in the substrate device according to the first embodiment by the above steps.

Next, in step (10), hydrogen is included in the polysilicon film 202 (the polysilicon film 202 is hydrogenated) by annealing the polysilicon film 202 in an atmosphere including hydrogen in a furnace (a diffusing furnace). In addition, according to the annealing, hydrogen is automatically included in the interface between the polysilicon film 202 and the thermal oxide silicon film 204 that is a gate insulating film, and around the interface.

According to the present embodiment, in particular, it is possible to introduce hydrogen into the polysilicon film 202 or the channel region 202a' of the polysilicon film 202 without a problem because the aperture 208BM illustrated in FIG. 5 is formed in the nitride film 208B. If the nitride film 208B without the aperture 208BM exists to cover the polysilicon film 202, it is not possible to perform enough hydrogenation because the progress of hydrogen is obscured by the nitride film 208B, which is significantly different from the present embodiment in that the hydrogenation cannot be sufficiently performed.

Dangling bonds in the polysilicon film 202 and in the interface are terminated to have a form where hydrogen H is entangled, such as Si—H bonds and Si—OH bonds by such effective hydrogenation. Accordingly, according to the substrate device related to the first embodiment, the interface level caused by the presence of the dangling bonds is not generated and it is possible to maintain the excellent on/off properties of the thin film transistor.

Moreover, in the above embodiment, hydrogen is introduced into the polysilicon film 202 by performing hydrogen annealing. However, according to the present invention, a method of using hydrogen plasma, a sinter processing including hydrogen, or a processing of implanting hydrogen ions may be performed in order to introduce hydrogen into the polysilicon film 202. Further, it should be understood that the step of performing the hydrogenation is not limited to be performed right after the capacitor is formed as described above. For example, as described hereinafter in (a method of manufacturing the electro-optical device), in the case of forming the interlayer insulating film and the pixel electrode after step (10) of FIG. 4, the hydrogenation may be performed after performing processes of forming the elements.

In the substrate device according to the first embodiment which is manufactured by the above method and has the above structure, it is possible to obtain the following effects. In other words, it is possible to increase the capacity of the capacitor in the first embodiment compared to conventional technology because the nitride film 208B with a large dielectric constant is included as the dielectric film of the capacitor. Further, according to the first embodiment, in particular, the dielectric film of the capacitor is formed so that the nitride film 208B and the oxide film 208A form a laminated structure. Thus, it is possible to improve the voltage-proof properties of the capacitor.

Further, moisture does not permeate the polysilicon film 202 with the presence of the nitride film 208B. Accordingly, according to the first embodiment, it is possible to prevent the occurrence of a phenomenon where the positive charge is generated and a threshold voltage Vth increases because water molecules diffuse to the interface between the gate insulating film of the thin film transistor and the semiconductor layer of the thin film transistor.

Moreover, according to the first embodiment, in step (10), the nitride film 208B formed in step (8) does not obstruct the introduction of hydrogen into the polysilicon film 202 in performing hydrogenation. This is because the aperture 208BM is formed in the nitride film 208B in step (8). Hydrogen introduced during the hydrogenation reaches the polysilicon film 202 or the channel region 202a' of the polysilicon film 202 through the aperture 208BM without a problem. Thus, enough hydrogen is introduced into the polysilicon film 202. Accordingly, it is possible to effectively terminate the dangling bonds in the polysilicon film 202.

In addition, according to the first embodiment, as described above, after forming the nitride film 208B by the nitration by plasma or the spattering method, hydrogenation is performed. Accordingly, the following effects are obtained. That is, in the case of forming the nitride film 208B by such a method, the process is performed at a relatively high temperature of about 650 to 800° C. Herein, considering the case of performing the above-described hydrogenation process before forming the nitride film 208B, the Si—H bonds generated by the process are exposed to the high temperature, at which the process of forming the nitride film 208B is performed after the hydrogenation process. Accordingly, in this case, the barely generated Si—H bonds may be cut.

However, according to the first embodiment, the above-described problem does not occur because hydrogenation is performed after forming the nitride film 208B. That is, it is possible to maintain the previously generated Si—H bonds until the substrate device is forwarded.

As described above, according to the substrate device related to the first embodiment, it is possible to manufacture the TFT which has excellent properties and is capable of maintaining those excellent properties for a long time.

Next, a second embodiment of the present invention will now be described with reference to FIGS. 6 to 1. The second embodiment relates to an electro-optical device, in which the substrate device according to the above-described embodiment is used as a TFT-array substrate, a counter substrate is arranged to face the TFT-array substrate and an electro-optical material, such as liquid crystal is interposed between the TFT-array substrate and the counter substrate.

Figure 7:
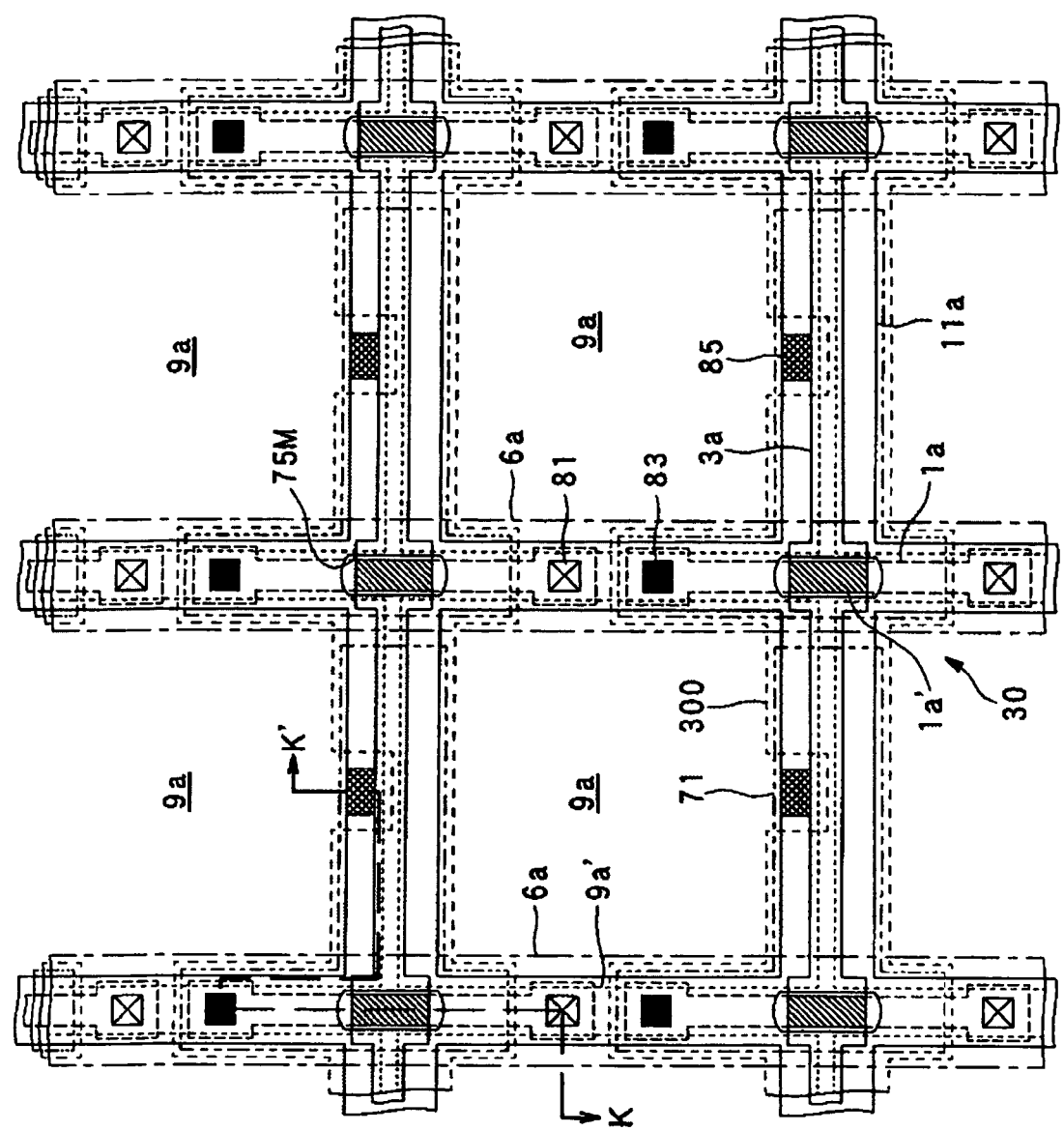
FIG. 7 is a plan view of a group of a plurality of adjacent pixels on a TFT-array substrate where data lines, scanning lines and pixel electrodes are formed, in the electro-optical device according to the second embodiment of the present invention.
Figure 8:
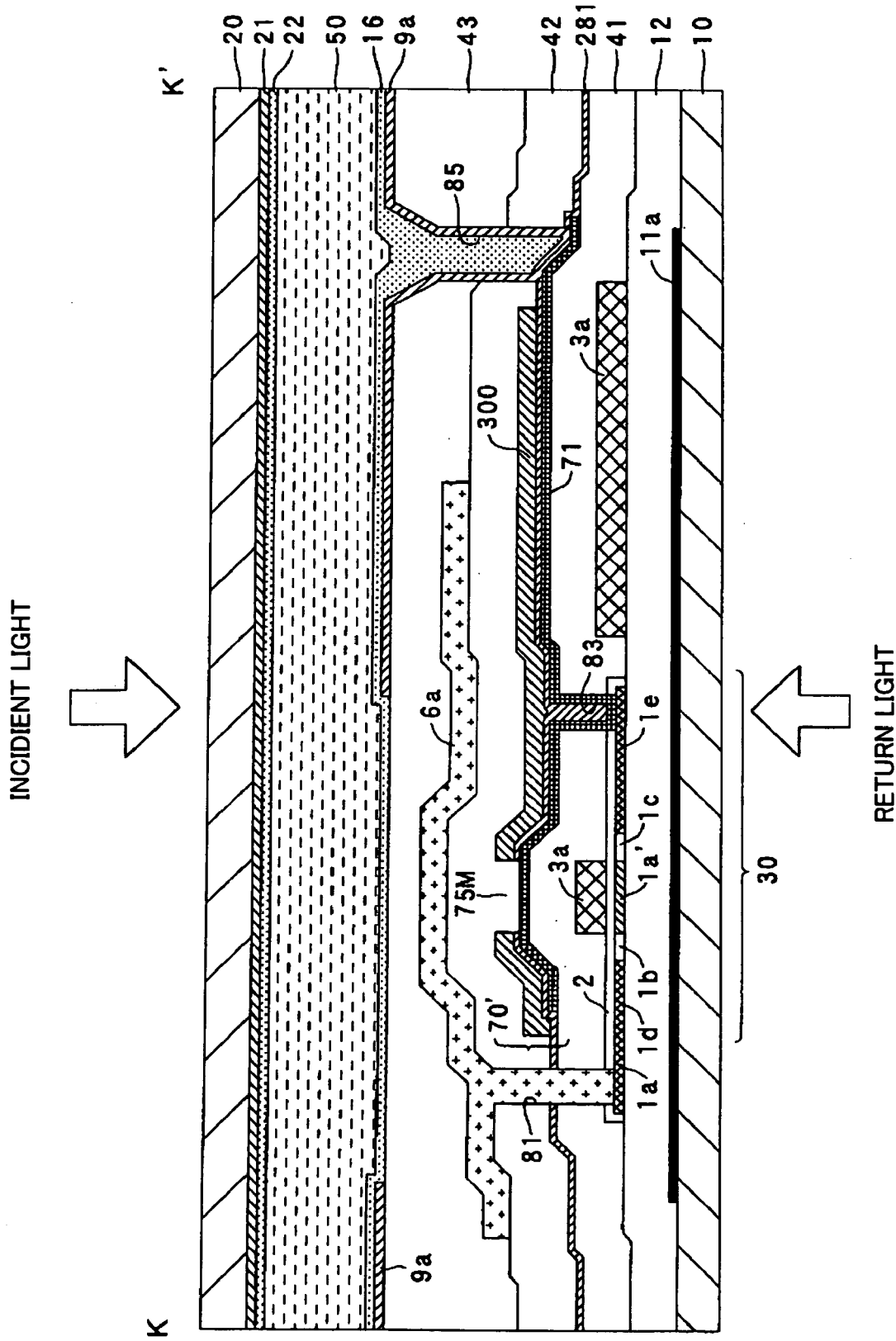
FIG. 8 is a sectional view taken along the line K–K' of FIG. 7.

First, the structure and the operation of the image display region of the electro-optical device according to the second embodiment will be described with reference to FIGS. 6 to 8. Herein, FIG. 6 illustrates an equivalent circuit of various elements and wiring lines in a plurality of matrix-shaped pixels that form the image display region of the electro-optical device. Further, FIG. 7 is a plan view of a group of a plurality of adjacent pixels on the TFT-array substrate where data lines, scanning lines and pixel electrodes are formed. FIG. 8 is a sectional view taken along the line K–K' of FIG. 7.

Figure 6:
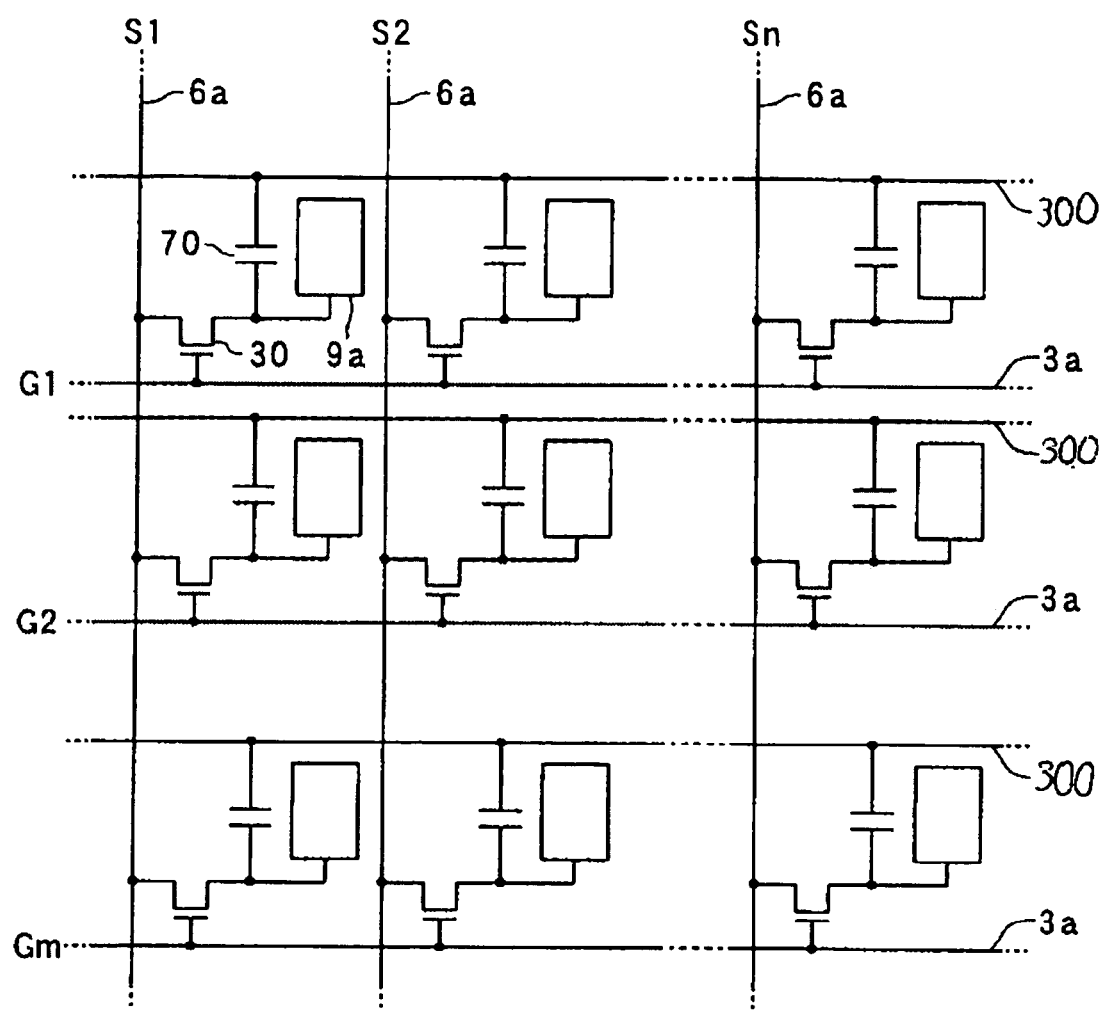
FIG. 6 is an exemplary circuit diagram illustrating an equivalent circuit of various elements and wiring lines provided in a plurality of matrix-shaped pixels that form an image display region in an electro-optical device according to a second embodiment of the present invention.

In FIG. 6, in a plurality of matrix-shaped pixels that form the image display region of the electro-optical device according to the second embodiment, pixel electrodes 9a and TFTs 30 for controlling switching of the pixel electrodes 9a are formed, and data lines 6a to which image signals are supplied are electrically connected to the sources of the TFTs 30. Image signals S1, S2, . . . , and Sn written in the data lines 6a may be sequentially supplied in the order and may be supplied to each group for the plurality of data lines 6a adjacent to each other.

Further, scanning lines 3a are electrically connected to the gates of the TFTs 30. At a predetermined timing, scanning signals G1, G2, . . . , and Gm are sequentially applied to the scanning lines 3a in the manner of a pulse in the order. The pixel electrodes 9a are electrically connected to the drains of the TFTs 30 and record the image signals S1, S2, . . . , and Sn supplied from the data lines 6a at predetermined timing by switching on the TFTs 30 that are switching elements for a predetermined period.

The image signals S1, S2, . . . , and Sn of a predetermined level which are written through the pixel electrodes 9a in liquid crystal which is an example of an electro-optical material are held between the pixel electrodes 9a and the counter electrodes formed in the counter substrate for a predetermined period. Liquid crystal enables gray scales to be displayed by changing the alignment and the order of a set of molecules by an applied voltage to thus modulate light. In a normally white mode, the transmittance of incident light is reduced in accordance with voltages applied separately to each pixel. In a normally black mode, the transmittance of the incident light increases in accordance with the voltages applied separately to each pixel. As a result, light with contrast suitable for the image signals is emitted from the electro-optical device.

Herein, storage capacitors 70 are added in parallel with liquid crystal capacitors formed between the pixel electrodes 9a and the counter electrodes in order to prevent the held image signals from leaking. The storage capacitors 70 parallel to the scanning lines 3a include fixed potential side capacitive electrodes, and capacitive lines 300 fixed to constant potential. In addition, it can be understood that the storage capacitors 70 correspond to the capacitor according to the first embodiment.

The structure of the electro-optical device, in which the above-described circuit operation is realized by the data lines 6a, the scanning lines 3a and TFTs 30, will now be described with reference to FIGS. 7 and 8. First, the electro-optical device according to the second embodiment, as illustrated in FIG. 8 that is a sectional view taken along the line K–K' of FIG. 7, includes a transparent TFT-array substrate 10 and a transparent counter substrate 20 arranged to face the TFT-array substrate 10. The TFT-array substrate 10 is formed of, for example, a quartz substrate, a glass substrate or a silicon substrate. The counter substrate 20 is formed of, for example, the glass substrate or the quartz substrate.

As illustrated in FIG. 8, a pixel electrode 9a is provided above the TFT-array substrate 10. An alignment film 16, on which predetermined alignment processing, such as rubbing processing is performed, is provided on the pixel electrode 9a. The pixel electrode 9a can be formed of a transparent conductive film, such as an ITO (indium tin oxide) film. On the other hand, a counter electrode 21 is provided on the entire surface of the counter substrate 20. An alignment film 22, on which the predetermined alignment processing such as rubbing processing is performed, is provided under the counter electrode 21. The counter electrode 21 can be formed of a transparent conductive film, such as an ITO film similarly to the pixel electrode 9a. The alignment films 16 and 22 are formed of a transparent organic film, such as a polyimide film.

The electro-optical material such as liquid crystal is enclosed in a space surrounded by a later-described sealing material (see FIGS. 10 and 11) and is sealed up to form a liquid crystal layer 50 between the TFT-array substrate 10 and the counter substrate 20, in which the TFT-array substrate 10 and the counter substrate 20 are arranged to face each other. The liquid crystal layer 50 has a predetermined alignment state with the alignment films 16 and 22 in a state where an electric field is not applied by the pixel electrode 9a. The liquid crystal layer 50 is formed of an electro-optical material obtained by mixing a kind of or several kinds of nematic liquid crystal with each other. The sealing material is an adhesive formed of, for example, radiation curing resin or thermal or thermosetting resin for bonding the TFT substrate 10 and the counter substrate 20 therearound. A spacer, such as glass fiber or glass bead, for setting the distance between the TFT substrate 10 and the counter substrate 20 at a predetermined value is mixed with the sealing material.

Meanwhile, in FIG. 7, the plurality of matrix-shaped pixel electrodes 9a are formed on the TFT-array substrate 10 and the outlines of the pixel electrodes 9a are illustrated by dotted lines 9a'. The data lines 6a and the scanning lines 3a are provided along the horizontal and vertical boundaries of the pixel electrodes 9a. The data lines 6a are formed of a metal film such as an aluminum film or an alloy film. Further, the scanning lines 3a are formed of conductive polysilicon. The scanning lines 3a are arranged to face channel regions 1a' illustrated in shaded regions rising to the right side of the drawing in the semiconductor layers 1a. The scanning lines 3a function as gate electrodes. Pixel switching TFTs 30, in which the main lines of the scanning lines 3a as the gate electrodes are arranged to face the channel regions 1a', are provided in the portions, in which the scanning lines 3a and the data lines 6a intersect each other.

The TFT 30 has an LDD (lightly doped drain) structure as illustrated in FIG. 8. The TFT 30 includes the scanning line 3a that functions as the gate electrode, the channel region 1a' of the semiconductor layer 1a which is formed of, for example, a polysilicon film and in which channels are formed by the electric field from the scanning line 3a, an insulating film 2 including a gate insulating film for insulating the scanning line 3a and the semiconductor layer 1a from each other, a low concentration source region 1b, a low concentration drain region 1c, a high concentration source region 1d and a high concentration drain region 1e in the semiconductor layer 1a.

Moreover, the TFT 30 preferably has the LDD structure as illustrated in FIG. 8. However, the TFT 30 may have an offset structure, in which impurities are not implanted into the low concentration source region 1b and the low concentration drain region 1c. A self-aligned TFT that forms the high concentration source region and the high concentration drain region by self-matching by implanting the impurities with high concentration using the gate electrode formed of a part of the scanning line 3a as a mask may be used. Further, according to the second embodiment, a single gate structure, in which only one gate electrode of the pixel switching TFT 30 is arranged between the high concentration source region 1d and the high concentration drain region 1e, is adopted.

However, two or more gate electrodes may be arranged between the high concentration source region 1d and the high concentration drain region 1e. When the TFT is formed of dual gates, triple gates or a larger number of gates, it is possible to prevent the current from leaking in the portions where the channel and the source and drain regions are bonded to each other, to thus reduce the amount of current when the TFT is turned off. Furthermore, the semiconductor layer 1a that forms the TFT 30 may be either a non-single crystal layer or a single crystal layer. A well-known method, such as a bonding method may be used for forming the single crystal layer. In particular, it is possible for a peripheral circuit to perform well by using the single crystal layer as the semiconductor layer 1a.

Meanwhile, in FIGS. 7 and 8, a relay layer 71 (corresponding to an example of the first electrode according to the present invention) as a pixel potential side capacitive electrode, which is connected to the high concentration drain region 1e of the TFT 30 and the pixel electrode 9a, and a part of the capacitive line 300 (corresponding to an example of the second electrode according to the present invention) as a fixed potential side capacitive electrode are arranged to face each other through a dielectric film 75 to thus form a storage capacitor 70. According to the storage capacitor 70, it is possible to remarkably improve the potential holding properties of the pixel electrode 9a.

The relay layer 71 formed of, for example, a conductive polysilicon film functions as the pixel potential side capacitive electrode. However, the relay layer 71 may be formed of a single-layered film or a multi-layered film including metals or alloys similar to the later described capacitive line 300. The relay layer 71 has a function of relaying the pixel electrode 9a to the high concentration drain region 1e of the TFT 30 through the contact holes 83 and 85 (corresponding to an example of the first contact hole and the second contact hole according to the present invention) in addition to the function as the pixel potential side capacitive electrode. When the relay layer 71 is used, it is possible to easily connect the pixel electrode 9a and the high concentration drain region 1e to each other through two or more serial contact holes each having a relatively small diameter without technical difficulties caused by connecting the pixel electrode 9a and the high concentration drain region 1e to each other through one contact hole even if the interlayer distance is as long as, for example, about 2000 nm and to thus increase a pixel aperture ratio. Further, it is possible to prevent the penetration caused by performing etching when the contact hole is opened. Further, in view of another aspect, when the pixel electrode 9a and the TFT 30 are electrically connected to each other through the relay layer 71, it is possible to increase the degrees of freedom of the layout of the pixel electrode 9a, the TFT 30 and the storage capacitor 70 on the substrate and to more efficiently perform such a layout.

The capacitive line 300 formed of a conductive film including, for example, metal or alloy functions as the fixed potential side capacitive electrode. As seen in plan view, the capacitive line 300 is formed to overlap the region in which the scanning line 3a is formed, as illustrated in FIG. 7. More specifically, the capacitive line 300 includes a main line extended along the scanning line 3a, a protrusion that protrudes upward along the data line 6a from the portion that intersects the data line 6a, and a constricted portion which is slightly constricted at a portion corresponding to the contact hole 85. The protrusion contributes to the increase in a region where the storage capacitor 70 is formed using a region above the scanning line 3a and a region under the data line 6a. The capacitive line 300 extends from an image display region 10a where the pixel electrode 9a is arranged to the periphery of the image display region 10a and is electrically connected to a constant potential source to thus be a fixed potential. The constant potential source may be the constant potential source of a positive power source or a negative power source supplied to a data line driving circuit 101 and may be a constant potential supplied to the counter electrode 21 of the counter substrate 20.

As described above, according to the second embodiment, it is possible to reduce the number of wiring lines for making the capacitive line 300 have the fixed potential because the capacitive line 300 includes the fixed potential side capacitive electrode of the storage capacitor 70. Further, according to the second embodiment, it is possible to significantly increase the pixel aperture ratio because the capacitive line 300 is formed overlapping the scanning line 3a and between the pixel electrodes 9a (see FIG. 7). Moreover, when the capacitive line 300 is used as a fixed potential side capacitive electrode, the degrees of freedom of the layout of the storage capacitor 70, the TFT 30 and the pixel electrode 9a on the substrate increases. Furthermore, it is possible to effectively perform such a layout. For example, in FIG. 7, the capacitive line 300 and the scanning line 3a are formed to overlap each other. However, they may be formed to extend in parallel with each other in the same plane.

According to the second embodiment, in particular, the dielectric film 75 is formed of a relatively thin nitride film such as SiN whose film thickness is about 5 to 200 nm as illustrated in FIG. 8. A dielectric film 75 is preferably thinner as long as it is possible to obtain enough reliability of the dielectric film 75 in view of increasing the storage capacitor 70. An aperture 75M is formed in the dielectric film 75 as illustrated in FIGS. 7 and 8. It seems that the surface of the channel region 1a' of the semiconductor layer 1a that forms the TFT 30 is shown through the aperture 75M. However, the channel region 1a' may not necessarily be actually seen because other elements such as the scanning line 3a exist. According to the second embodiment, a plurality of matrix-shaped apertures 75M of the dielectric film 75 are formed corresponding to the plurality of matrix-shaped TFTs 30 and semiconductor layers 1a. Moreover, because the dielectric film 75 is formed to cover the entire surface of the TFT-array substrate 10, in FIG. 7, the dielectric film 75 excluding the aperture 75M is not clearly described.

In addition, an aperture is also formed in the capacitive line 300 in the position corresponding to that of the aperture 75M of the dielectric film 75 (see FIG. 8). This makes it possible to prevent the occurrence of short circuit between the capacitive line 300 and the relay layer 71. In the case where the dielectric film 75 has a structure in which the oxide film and the nitride film are stacked as illustrated in the first embodiment, the short circuit between the capacitive line 300 and the relay layer 71 does not occur if only the oxide film is formed to cover the aperture 75M. Accordingly, in such a case, the aperture of the capacitive line 300 is not necessarily provided.

As described above, the relay layer 71, the dielectric film 75 and the capacitive line 300 that form the storage capacitor 70 correspond to the drain electrode film 216, the oxide film 208A and the nitride film 208B (the dielectric film) and the upper electrode film 218 that form the capacitor in the substrate device according to the first embodiment, respectively.

In FIGS. 7 and 8, a lower light shielding film 11a is formed below the TFT 30. The lower light shielding film 11a is patterned in a lattice to define the aperture region of each pixel. Further, the aperture region is also defined by the data line 6a and the capacitive line 300 formed to intersect the data line 6a in FIG. 7. Further, the lower light shielding film 11a preferably extends from the image display region to the periphery of the image display region to be connected to the constant potential source in order to prevent a change in the potential of the lower light shielding film 11a from exerting negative influences on the TFT 30 similarly to the above-described capacitive line 300.

Further, a base insulating film 12 is provided under the TFT 30. The base insulating film 12 formed on the entire surface of the TFT-array substrate 10 has a function of preventing a change in the properties of the pixel switching TFT 30 which is caused by roughness during the abrasion of the surface of the TFT-array substrate 10 and dirt left after performing cleansing in addition to the function of inter-layer-insulating the TFT 30 from the lower light shielding film 11a.

In addition, a first interlayer insulating film 41 provided with a contact hole 81 that leads to the high concentration source region 1d and a contact hole 83 that leads to the high concentration drain region 1e, is formed on the scanning line 3a. The relay layer 71 and the capacitive line 300 are formed on the first interlayer insulating film 41. A second interlayer dielectric film 42 provided with the contact hole 81 that leads to the high concentration source region 1d and a contact hole 85 that leads to the relay layer 71 is formed on the relay layer 71 and the capacitive line 300. Moreover, according to the present embodiment, it is possible to activate the ions implanted into the polysilicon film that forms the semiconductor layer 1a or the scanning line 3a by baking the first interlayer insulating film 41 at 1000° C. On the other hand, it is possible to reduce the stress generated around the interface of the capacitive line 300 by not burning a second interlayer insulating film 42.

The data line 6a is formed on the second interlayer insulating film 42. A third interlayer insulating film 43, in which a contact hole 85 that leads to the relay layer 71 is formed, is formed on the second interlayer insulating film 42 and the data line 6a. The surface of the third interlayer insulating film 43 is flattened by a CMP (chemical mechanical polishing) process. Thus, it is possible to reduce the deterioration of the alignment of a liquid crystal layer 50 which is caused by a step due to various wiring lines and elements under the third interlayer insulating film 43. However, the surface of the third interlayer insulating film 43 may be flattened by grooving at least one among the TFT-array substrate 10, the base insulating film 12, the first interlayer insulating film 41 and the second interlayer insulating film 42 and by burying the wiring line such as the data line 6a or the TFT 30 in the groove instead of flattening the third interlayer insulating film 43 by the CMP process or in addition to flattening the third interlayer insulating film 43 by the CMP process.

As described above, in the electro-optical device according to the second embodiment, the dielectric film 75 that forms the storage capacitor 70 for improving the potential holding properties of the pixel electrode 9a is formed of the nitride film. Further, the aperture 75M, through which the surface of the semiconductor layer 1a of the TFT 30 is likely seen, is formed in the dielectric film 75. Thus, the effects according to the substrate device of the second embodiment are almost the same as the effects according to the substrate device of the first embodiment. That is, because the dielectric film 75 is formed of the nitride film with a relatively large dielectric constant, it is possible to increase the capacity of the capacitor 70. Further, it is possible to improve the moisture proof properties of the TFT 30 which is the pixel-switching element with the presence of the nitride film. Moreover, it is possible to hydrogenate the semiconductor layer 1a of the TFT 30 sufficiently with the presence of the aperture 75M.

Figure 9:
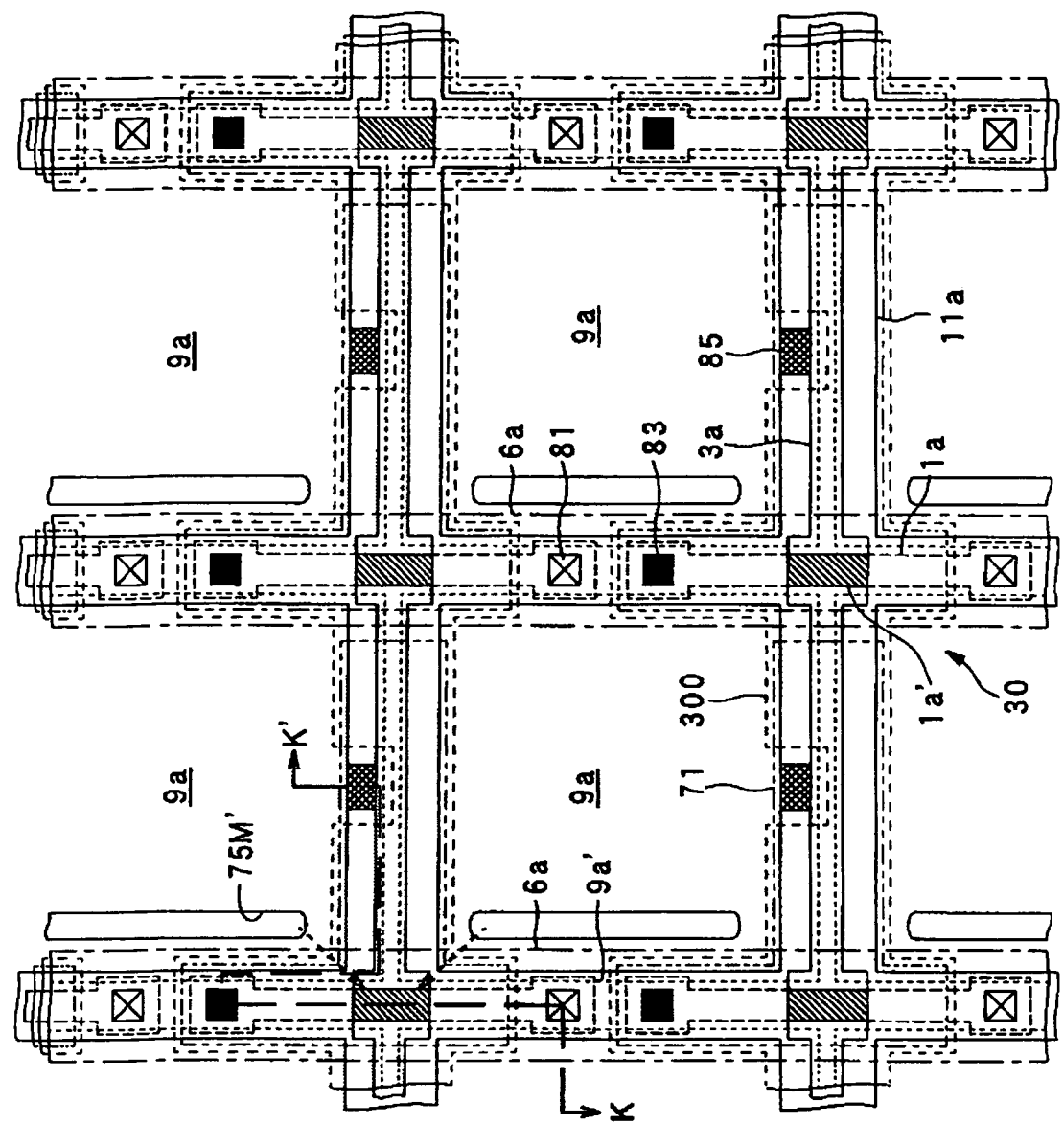
FIG. 9 is a plan view similar to FIG. 7 and illustrating a modification of the second embodiment.

Moreover, in the above description, the aperture 75M is formed toward the surface of the semiconductor layer 1a, in particular, the entire surface of the channel region 1a'. However, it should be understood that the present invention is not limited to this. For example, as illustrated in FIG. 9, an aperture 75M' may be formed not directly above the semiconductor layer 1a but in a position slightly deviated from the semiconductor layer 1a. That is, the nitride film that forms the transparent dielectric film 75 is formed on the front surface of the pixel display region. The aperture 75M' is provided at the edge of the pixel electrode 9a along the data line 6a. Even if the aperture is not formed directly above the semiconductor layer 1a, it is possible to introduce hydrogen through the semiconductor layer 1a. This is because the hydrogen atoms introduced into the aperture 75M' diffuse into the first interlayer insulating film 41 to reach the semiconductor layer 1a or the channel region 1a' as illustrated by a dashed-line arrow of FIG. 9. According to the present invention, any type of aperture can be used as long as effective hydrogenation can be performed.

However, it is not preferable to provide an aperture having a too large area to the nitride film because the nitride film is expected to prevent moisture from permeating. On the contrary, in FIGS. 7 and 9, elements other than the pixel electrodes 9a are not allowed to exist in a region where the pixel electrode 9a is formed, that is, a region where light transmits. Thus, it is allowed in some cases to provide an aperture having a relatively large area in the region. This is because it is possible to prevent the brightness of an image from deteriorating by doing so.

It is possible to appropriately define the specific shape of the nitride film or the aperture by experiments, experiences, theories or simulations in consideration of the above-described circumstances.

Figure 10:
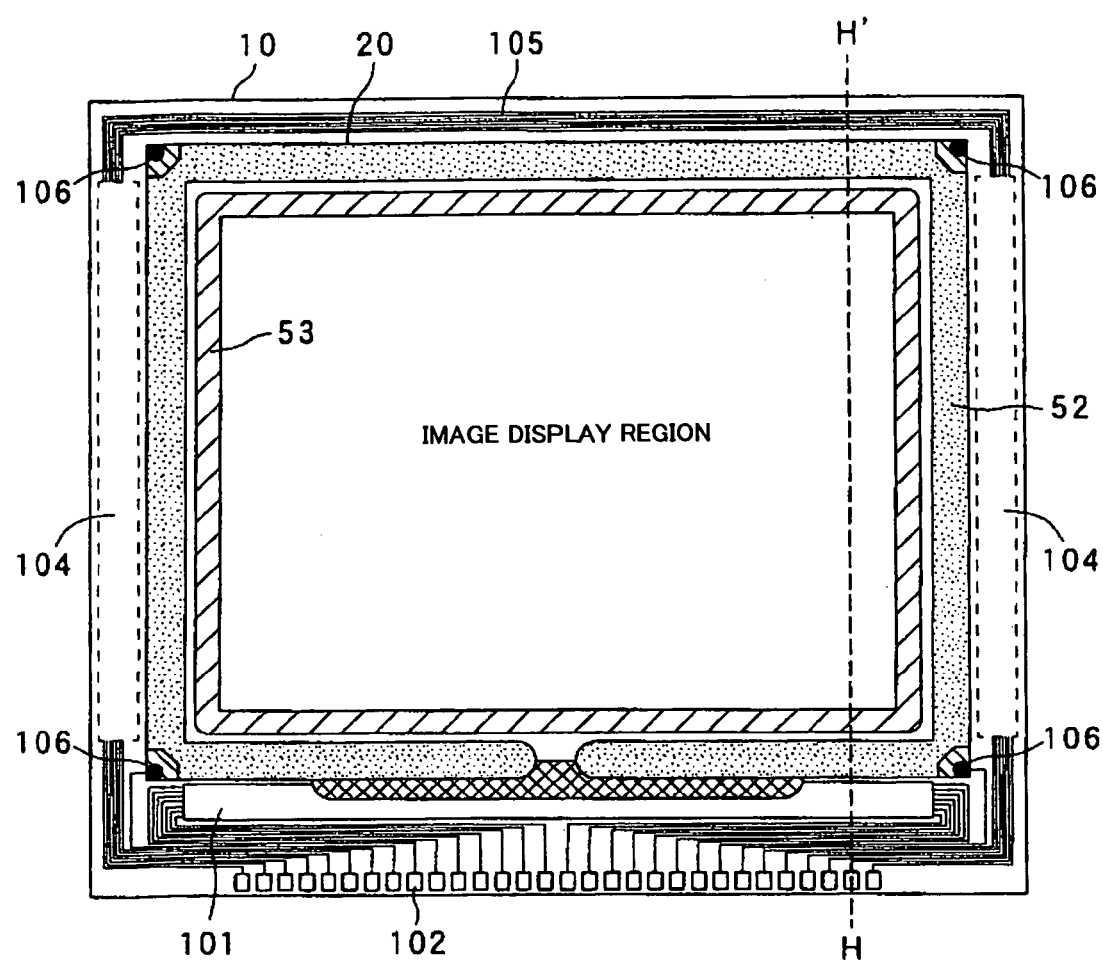
FIG. 10 is a plan view of a TFT-array substrate in the electro-optical device according to the second embodiment of the present invention together with the respective elements formed thereon, as seen from the side of the counter substrate.
Figure 11:
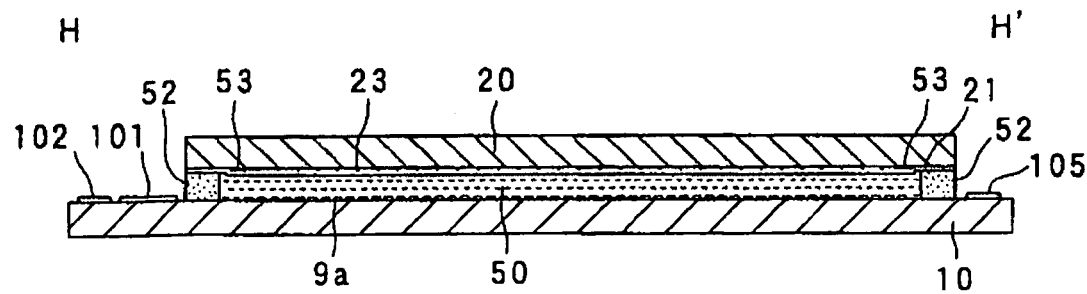
FIG. 11 is a sectional view taken along the line H–H' of FIG. 10.

The construction of the electro-optical device having the above construction is illustrated in, for example, FIGS. 10 and 11. Herein, FIG. 10 is a plan view of the TFT-array substrate 10 together with the elements formed on the TFT-array substrate 10 seen from the counter substrate 20. FIG. 11 is a sectional view taken along the line H–H' of FIG. 10 including the counter substrate 20.

In FIG. 10, a sealing material 52 is provided on the TFT-array substrate 10 along the edge of the TFT-array substrate 10. A frame-shaped light shielding film 53 that defines the outer most circumference of the image display region 10a is provided parallel to the inside of the sealing material 52. A data line driving circuit 101 and an external circuit connection terminals 102 are provided along one side of the TFT-array substrate 10 and scanning line driving circuits 104 are provided along two sides adjacent to the one side of the array substrate 10. A plurality of wiring lines 105 for connecting the scanning line driving circuits 104 provided on both sides of the image display region to each other are provided along the remaining one side of the TFT-array substrate 10. Further, upper and lower conductive materials 106 for establishing an electric conduction between the TFT-array substrate 10 and the counter substrate 20 are provided in at least one portion of the corners of the counter substrate 20. Also, as illustrated in FIG. 10, the counter substrate 20 with almost the same outline as the outline of the sealing material 52 is secured to the TFT-array substrate 10 by the sealing material 52.

According to the present embodiment, the pixel switching TFT 30 formed in the image display region 10a is preferably formed of the N-channel type TFT. The TFT that forms a peripheral circuit such as the data line driving circuit 101 and the scanning line driving circuit 104 formed in a peripheral region is preferably formed of the CMOS type TFT including the N-channel type TFT and the P-channel type TFT. By doing so, it is possible to easily perform pixel switching at a high driving frequency using the N-channel type TFT which is excellent in carrier mobility because of electrons as a carrier, to form a peripheral circuit using CMOS with an excellent driving current properties and to prolong the life of the device as a whole.

Further, according to the embodiments of the electro-optical device described with reference to FIGS. 6 to 11, the TFT-array substrate 10 may be electrically and mechanically connected to the driving LSI mounted on, for example, a tape automated bonding (TAB) substrate through an anisotropic conductive film provided in the peripheral portion of the TFT-array substrate 10 instead of providing the data line driving circuit 101 and the scanning line driving circuit 104 on the TFT-array substrate 10. Further, according to the above-described electro-optical device, a polarization film, a phase difference film and a polarization plate are arranged on the external surface of the counter substrate 20 and the outer surface of the TFT-array substrate 10 in a preset direction in accordance with, for example, an operation mode such as a twisted nematic (TN) mode, a super twisted nematic (STN) mode, a vertically aligned ("VA") mode, and a polymer dispersed liquid crystal (PDLC) mode, a normally-white mode and a normally-black mode.

A method of manufacturing the electro-optical device having the above-described structure will now be described. As can be understood by comparing step (10) of FIG. 4 with FIG. 8 described in the first embodiment, strictly speaking, a slight difference lies between FIG. 8 and step (10) of FIG. 4 in the arrangement of the data lines 6a corresponding to the source electrode film 212. However, they have basically the same structure. Further, the difference is not important to the present invention. Accordingly, in the second embodiment, a case of manufacturing an electro-optical device such as a liquid crystal device with a pixel portion including the TFT following step (10) of FIG. 4 will be described.

First, it is assumed that the plurality of matrix-shaped TFTs 30 is formed on a substrate 200. Further, the gate electrode films 206 and the source electrode films 212 are formed on the substrate 200 in stripes to correspond to the matrix. The gate electrode films 206 and the source electrode film 212 are lattice-shaped as a whole. Thus, the gate electrode films 206 form parts of the scanning lines 3a. The source electrode films 212 form parts of the data lines 6a.

On the above assumption, in order to manufacture the electro-optical device and the pixel portions thereof, after forming third interlayer insulating films as upper layers of the upper electrode films 218 following step (10) of FIG. 4, contact holes are formed in the third interlayer insulating films and the pixel electrodes 9a formed of a transparent conductive material such as an ITO are formed on the third interlayer insulating films to bury the contact holes. After coating the pixel electrodes 9a with coating liquid formed of a transparent organic material of a polyimide group, a rubbing process is performed in a predetermined direction to have a predetermined pretilt angle. As a result, an alignment film 16 is formed.

Thus, the manufacturing of the TFT-array substrate 10 is completed. Meanwhile, the counter substrate 20 formed of a glass substrate and a quartz substrate is prepared. The counter electrode 21 is formed on the entire surface of the counter substrate 20 using the transparent conductive material such as the ITO by the spattering method. Thereafter, the counter electrode 21 is coated with coating liquid formed of a transparent organic material of the polyimide group similarly to the alignment film 16. A rubbing process is performed in a predetermined direction to have the predetermined pretilt angle. As a result, an alignment film 22 is formed.

Finally, the manufacturing of the electro-optical device is completed by bonding the TFT-array substrate 10 in which the above mentioned various elements are formed, and the counter substrate 20 to each other so that the TFT-array substrate 10 faces the counter substrate 20, and by enclosing liquid crystal 50 which is an example of the electro-optical material into a gap between both substrates and by sealing up the gap.

Figure 12:
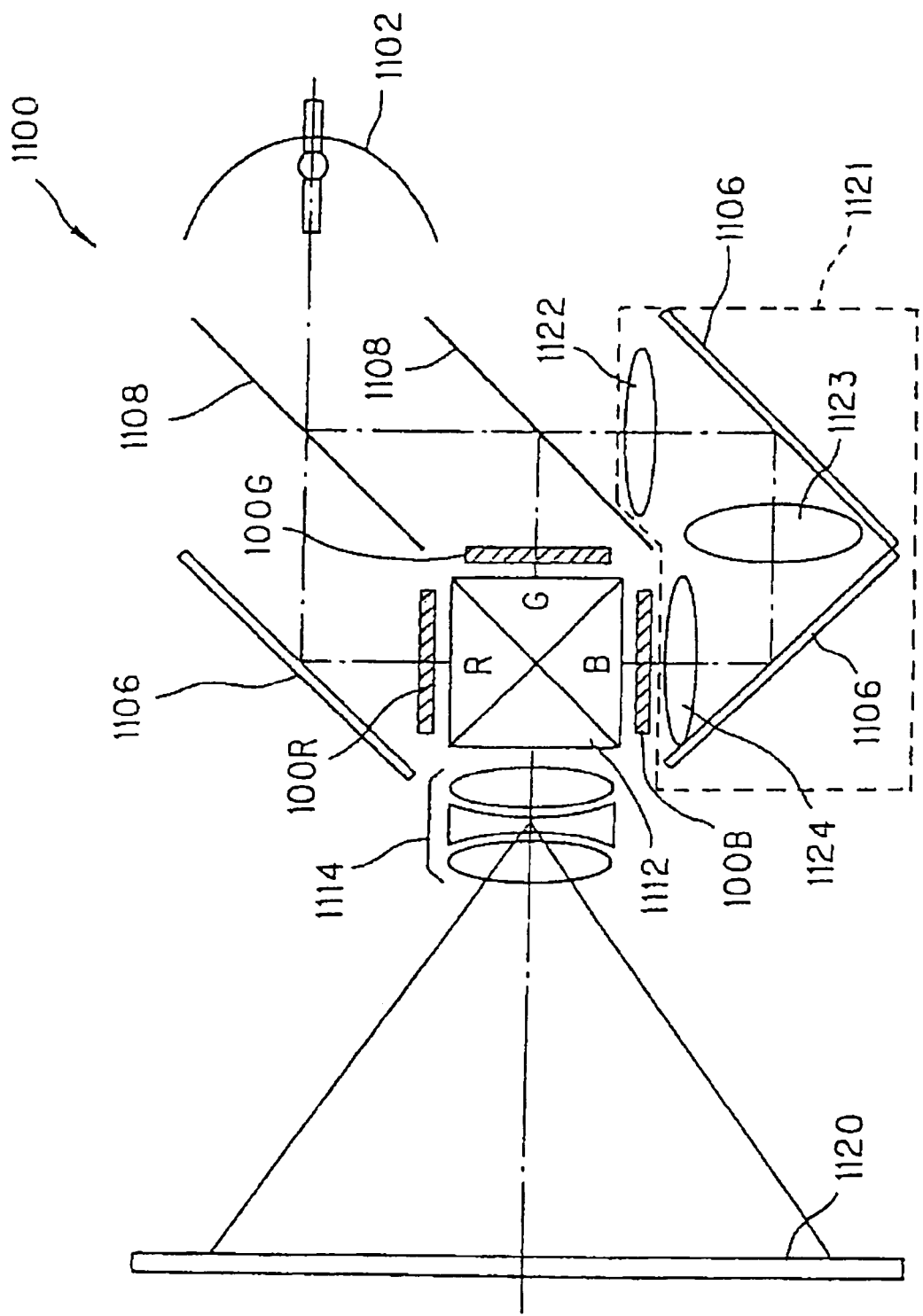
FIG. 12 is an exemplary schematic block diagram of a projection-type color display device according to an embodiment of an electronic apparatus according to the present invention.

Next, the entire construction, in particular, the optical construction of an embodiment of a projection-type color display device which is an example of an electronic apparatus using the above-described electro-optical device as a light valve will now be described. FIG. 12 is a schematic sectional view of the projection-type color display device.

In FIG. 12, in a liquid crystal projector 1100 which is an example of the projection-type color display device according to the present embodiment, three liquid crystal modules including a liquid crystal device 100 having a driving circuit mounted on the TFT-array substrate are prepared, and the three modules are used as RGB light valves 100R, 100G and 100B, respectively. In the liquid crystal projector 1100, when projection light is emitted from a lamp unit 1102 of a white light source such as a metal halide lamp, the projection light is divided into light components R, G and B corresponding to the three primary colors of RGB by three mirrors 1106 and two dichroic mirrors 1108. The light components R, G and B are guided into the light valves 100R, 100G and 100B corresponding to the respective colors. At this time, the B (blue) light is guided through a relay lens system 1121 including an incidence lens 1122, a relay lens 1123 and an exit lens 1124 in order to prevent optical loss caused by a long optical path. The light components corresponding to the three primary colors modulated by the light valves 100R, 100G and 100B, respectively, are recomposed by a dichroic prism 1112 and are projected to a screen 1120 as color images through a projection lens 1114.

It should be understood that the present invention is not limited to the above-described embodiments. Various changes may be appropriately made within a range without departing from the subject matter or the spirit of the invention which is found from the reading throughout the detailed description and the claims. The substrate device accompanying such changes, the method of manufacturing the same, an electro-optical device and an electronic apparatus are included in the technical scope of the present invention.

What is claimed is:

1. A substrate device, comprising:
   thin film transistors provided above a substrate, each including a semiconductor layer; and
   capacitors formed above the thin film transistors, each of the capacitors comprising a first electrode electrically connected to a part of the semiconductor layer, a second electrode arranged to face the first electrode, and a dielectric film including a nitride film arranged between the first electrode and the second electrode such that the first electrode is at a bottom surface of the nitride film and the second electrode is at a top surface of the nitride film; the nitride film having an aperture formed vertically above the semiconductor layer in plan view.

2. The substrate device according to claim 1, the aperture being formed vertically above a channel region of the semiconductor layer.

3. The substrate device according to claim 1, the dielectric film having a laminated structure including a layer formed of the nitride film.

4. The substrate device according to claim 3, a layer formed of an oxide film being included in the laminated structure.

5. The substrate device according to claim 1, the plurality of thin film transistors being arranged above the substrate in array.

6. An electro-optical device, comprising:

scanning lines extending above a substrate;

data lines extending in a direction intersecting the scanning lines;

thin film transistors formed to correspond to each intersection between the scanning lines and the data lines, each including a semiconductor layer;

pixel electrodes provided to correspond to the thin film transistors; and storage capacitors formed above the thin film transistors, each of the storage capacitors comprising a first electrode electrically connected to a part of the semiconductor layer, a second electrode arranged to face the first electrode, and a dielectric film including a nitride film arranged between the first electrode and the second electrode such that the first electrode is at a bottom surface of the nitride film and the second electrode is at a top surface of the nitride film; the nitride film having an aperture formed vertically above the semiconductor layer in plan view.

7. The electro-optical device according to claim 6, the apertures being formed within regions where the pixel electrodes are formed.

8. The electro-optical device according to claim 6, the pixel electrodes and the thin film transistors being arranged in a matrix and the scanning lines are formed in stripes to correspond to the matrix, the device further comprising capacitive lines of fixed potential formed parallel to the scanning lines, and the capacitive lines including the second electrodes.

9. The electro-optical device according to claim 6, further comprising:

first contact holes that electrically connect the first electrodes to a part of the semiconductor layer; and second contact holes that electrically connect the first electrodes to the pixel electrodes.

10. The electro-optical device according to claim 6, the thin film transistors being a plurality of N-channel type thin film transistors arranged in array, and the thin film transistors being provided in pixels in an image display region above the substrate for switching the pixels.

11. The electro-optical device according to claim 6, the data lines overlapping the apertures.

12. The electro-optical device according to claim 6, the nitride films being formed on the front surfaces of pixel regions, and the apertures being formed at the edge of the pixel electrodes.

13. An electronic apparatus, comprising:

scanning lines extending above a substrate;

data lines extending in a direction intersecting the scanning lines;

thin film transistors formed to correspond to each of intersections between the scanning lines and the data lines, each including a semiconductor layer;

pixel electrodes provided to correspond to the thin film transistors; and storage capacitors formed above the thin film transistors, each of the storage capacitors comprising a first electrode electrically connected to a part of the semiconductor layer, a second electrode arranged to face the first electrode, and a dielectric film including a nitride film arranged between the first electrode and the second electrode such that the first electrode is at a bottom surface of the nitride film and the second electrode is at a top surface of the nitride film; the nitride film having an aperture formed vertically above the semiconductor layer in plan view.

* * * * *